(12) United States Patent
Hoon

(10) Patent No.: US 8,741,717 B2
(45) Date of Patent: Jun. 3, 2014

(54) METHODS FOR FABRICATING INTEGRATED CIRCUITS HAVING IMPROVED METAL GATE STRUCTURES

(75) Inventor: Kim Hoon, Guilderland, NY (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/539,837

(22) Filed: Jul. 2, 2012

(65) Prior Publication Data

US 2014/0004693 A1    Jan. 2, 2014

(51) Int. Cl.
| | | |
|---|---|---|
| *H01L 21/8234* | (2006.01) | |
| *H01L 21/336* | (2006.01) | |
| *H01L 21/8238* | (2006.01) | |
| *H01L 21/3205* | (2006.01) | |
| *H01L 21/4763* | (2006.01) | |

(52) U.S. Cl.
USPC ........... 438/275; 438/197; 438/199; 438/585; 438/216; 257/369; 257/E21.637; 257/E21.444

(58) Field of Classification Search
USPC .......... 257/330, 331, 369, 371, 407, E21.637, 257/E21.444; 438/199, 589, 197, 216, 287, 438/585, 591, 183, 926, 275
See application file for complete search history.

(56) References Cited

U.S. PATENT DOCUMENTS

| | | | |
|---|---|---|---|
| 8,013,368 B2* | 9/2011 | Bohr | 257/288 |
| 2005/0272191 A1* | 12/2005 | Shah et al. | 438/197 |
| 2011/0081744 A1* | 4/2011 | Kawano | 438/95 |
| 2011/0147831 A1* | 6/2011 | Steigerwald et al. | 257/330 |
| 2011/0233778 A1 | 9/2011 | Lee et al. | |
| 2011/0298062 A1 | 12/2011 | Ganguli et al. | |
| 2012/0052641 A1* | 3/2012 | Lee et al. | 438/270 |
| 2012/0139053 A1* | 6/2012 | Ando et al. | 257/369 |
| 2012/0139061 A1* | 6/2012 | Ramachandran et al. | 257/410 |

* cited by examiner

*Primary Examiner* — Mary Wilczewski
*Assistant Examiner* — Erik T Peterson
(74) *Attorney, Agent, or Firm* — Ingrassia Fisher & Lorenz, P.C.

(57) ABSTRACT

Methods for fabricating integrated circuits are provided. One method includes forming first and second FET trenches in an interlayer dielectric material on a semiconductor substrate. The first FET trench is partially filled with a first work function metal to define an inner cavity in the first FET trench. The first work function metal is a N-type work function metal or a P-type work function metal. The N-type work function metal is selected from the group consisting of titanium, tantalum, hafnium, ytterbium silicide, erbium silicide, and titanium silicide. The P-type work function metal is selected from the group consisting of cobalt, nickel, and tungsten silicide. The inner cavity and the second FET trench are filled with a second work function metal to form corresponding metal gate structures. The second work function metal is the other of the N-type work function metal or the P-type work function metal.

20 Claims, 5 Drawing Sheets

US 8,741,717 B2

METHODS FOR FABRICATING INTEGRATED CIRCUITS HAVING IMPROVED METAL GATE STRUCTURES

TECHNICAL FIELD

The technical field relates generally to methods for fabricating integrated circuits, and more particularly relates to methods for fabricating integrated circuits with improved metal gate structures.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

In some integrated circuit designs there has been a desire to eliminate the use of polysilicon gate electrodes to improve device performance with decreased feature sizes. Replacing polysilicon gate structures with metal gate structures is one solution. Often, metal gate structures utilize tungsten as a metal fill portion in conjunction with a titanium nitride (TiN) P-type work function metal layer, and/or tantalum carbide (TaC) or titanium carbide (TiC) for N-type work function metal layer. The tungsten metal fill portion is used as a conductive metal fill to offset the relatively higher resistance of the work function metal layer(s), particularly TaC or TiC for N-type work function metal, to lower the overall resistance of the metal gate structure. Typically, the TiN work function metal layer and the TiC or TaC work function metal layer are deposited in trenches with high-k dielectric and barrier layers and a first recessing process is used to etch back the layers and form first recesses (e.g., recessed areas) in the trenches. The first recesses are filled with tungsten with TiN wetting layer to form the metal gate structures. Using a second recessing process, second recesses are formed in the trenches above the metal gate structures for receiving a passivation layer-forming material. However, the use of numerous layers and multiple recessing processes to form the metal gate structures present several technical challenges in smaller technology features. For example, as the gate lengths decrease so do the sizes of the trenches. Multiple depositions and recessing of the work function metal layers and the conductive metal fill in the smaller trenches becomes increasingly difficult to control, resulting in increased variability, leakage, and Vt shift.

Accordingly, it is desirable to provide methods for fabricating integrated circuits having improved metal gate structures. Furthermore, other desirable features and characteristics of the present invention will become apparent from the subsequent detailed description and the appended claims, taken in conjunction with the accompanying drawings and the foregoing technical field and background.

BRIEF SUMMARY

Methods for fabricating integrated circuits are provided herein. In accordance with an exemplary embodiment, a method for fabricating an integrated circuit includes forming a first FET trench in a first FET region and a second FET trench in a second FET region of an interlayer dielectric material on a semiconductor substrate. The first FET trench is partially filled with a layer of a first work function metal to define an inner cavity in the first FET trench. The first work function metal is one of a N-type work function metal and a P-type work function metal. The N-type work function metal is selected from the group consisting of titanium, tantalum, hafnium, ytterbium silicide, erbium silicide, and titanium silicide. The P-type work function metal is selected from the group consisting of cobalt, nickel, and tungsten silicide. The inner cavity and the second FET trench are filled with a second work function metal to form corresponding metal gate structures. The second work function metal is the other one of the N-type work function metal and the P-type work function metal.

In accordance with another exemplary embodiment, a method for fabricating an integrated circuit is provided. The method includes forming a NFET trench in a NFET region and a PFET trench in a PFET region of an interlayer dielectric material on a semiconductor substrate. A layer of a N-type work function metal is deposited overlying the NFET and PFET regions to partially fill the NFET and PFET trenches and define an inner cavity in the NFET trench. The N-type work function metal is selected from the group consisting of titanium, tantalum, hafnium, ytterbium silicide, erbium silicide, and titanium silicide. The N-type work function metal that is overlying the PFET region is removed, which includes removing the N-type work function metal from the PFET trench. A P-type work function metal is deposited overlying the PFET and NFET regions to fill the PFET trench and the inner cavity of the NFET trench and form corresponding metal gate structures. The P-type work function metal is selected from the group consisting of cobalt, nickel, and tungsten silicide.

In accordance with another exemplary embodiment, a method for fabricating an integrated circuit is provided. The method includes forming a NFET trench in a NFET region and a PFET trench in a PFET region of an interlayer dielectric material on a semiconductor substrate. A layer of a P-type work function metal is deposited overlying the NFET and PFET regions to partially fill the NFET and PFET trenches and define an inner cavity in the PFET trench. The P-type work function metal is selected from the group consisting of cobalt, nickel, and tungsten silicide. The P-type work function metal that is overlying the NFET region is removed, which includes removing the P-type work function metal from the NFET trench. A N-type work function metal is deposited overlying the NFET and PFET regions to fill the NFET trench and the inner cavity of the PFET trench and form corresponding metal gate structures. The P-type work function metal is selected from the group consisting of titanium, tantalum, hafnium, ytterbium silicide, erbium silicide, and titanium silicide.

BRIEF DESCRIPTION OF THE DRAWINGS

The various embodiments will hereinafter be described in conjunction with the following drawing figures, wherein like numerals denote like elements, and wherein:

FIGS. 1-15 illustrate the integrated circuit in cross sectional views during various stages of its fabrication.

DETAILED DESCRIPTION

Figure 1:
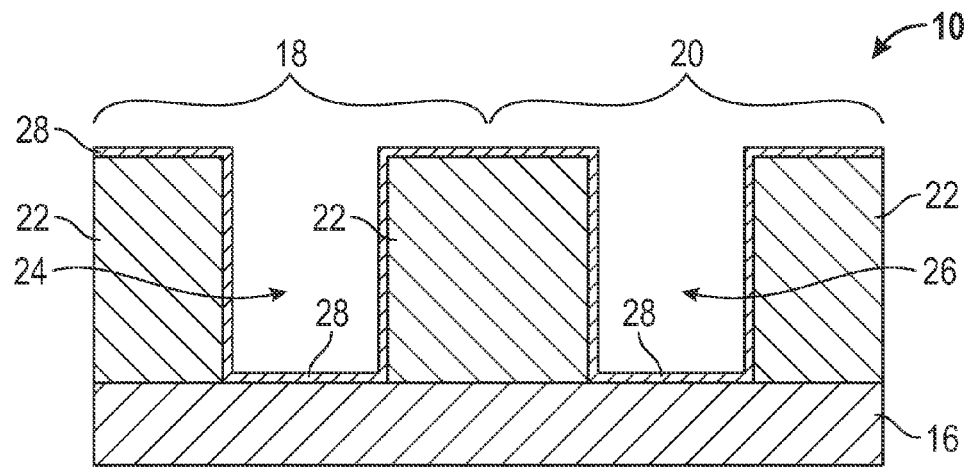
FIGS. 1-15 illustrate methods for fabricating integrated circuits having metal gate structures in accordance with various embodiments.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits having improved metal gate structures. In accordance with one embodiment, during intermediate stages of the fabrication of an integrated circuit (IC), a NFET trench and a PFET trench are formed in a NFET region and a PFET region, respectively, of an interlayer dielectric material on a semiconductor substrate. A layer of a N-type work function metal is deposited overlying the NFET and PFET regions to partially fill the NFET and PFET trenches and define an inner cavity in the NFET trench. The N-type work function metal is a conductive work function metal that is selected from the group of titanium, tantalum, hafnium, ytterbium silicide, erbium silicide, and titanium silicide. The N-type work function metal that is overlying the PFET region is removed, which includes removing the N-type work function metal from the PFET trench. A P-type work function metal is deposited overlying the PFET and NFET regions to fill the PFET trench and the inner cavity of the NFET trench and form corresponding metal gate structures. The P-type work function metal is a conductive work function metal that is selected from the group of cobalt, nickel, and tungsten silicide. Using a single recessing process, portions of the metal gate structures are recessed to form recesses in the NFET and PFET trenches. An insulator is deposited over each of the recesses to form a passivation layer over each of the metal gate structures, which is for protecting oxidation of the metal and preventing shorts between the gate to source/drain.

In accordance with another embodiment, after forming the NFET and PFET trenches, a layer of the P-type work function metal as discussed above is deposited overlying the NFET and PFET regions to partially fill the NFET and PFET trenches and define an inner cavity in the PFET trench. The P-type work function metal that is overlying the NFET region is removed, which includes removing the P-type work function metal from the NFET trench. The N-type work function metal as discussed above is deposited overlying the NFET and PFET regions to fill the NFET trench and the inner cavity of the PFET trench and form corresponding metal gate structures. Using a single recessing process, portions of the metal gate structures are recessed to form recesses in the NFET and PFET trenches. An insulator is deposited over each of the recesses to form a passivation layer over each of the metal gate structures.

It has been found that by using conductive N-type and P-type work function metals, which are more conductive than TiN and TaC or TiC work function metals, to form the metal gate structures, the resistance of the gate structures is sufficiently low that a conductive tungsten metal fill is no longer needed. As such, the gate forming process can be simplified by eliminating both the deposition of the tungsten metal fill and the recessing of the work function metal layers for receiving the tungsten metal fill, thereby improving process control and decreasing variability, leakage, and Vt shift.

FIGS. 1-15 illustrate methods for fabricating an IC 10 including forming metal gate structures 11, 12, 13, and 14 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the fabrication of ICs are well known and so, in the interest of brevity, many conventional steps will only be mentioned briefly herein or will be omitted entirely without providing the well known process details.

FIG. 1 illustrates, in cross sectional view, a portion of the IC 10 at an intermediate stage of fabrication in accordance with an exemplary embodiment. The IC 10 includes a semiconductor substrate 16 on which shallow trench isolation (STI) structures, source/drain regions, source/drain extension regions, gate dielectric, contacts, spacers, dummy gate patterns, hard masked layers, and other features may be formed. The semiconductor substrate 16 is typically a silicon wafer and includes various doping configurations as is known in the art to define a N-channel field effect transistor (NFET) region 18 and a P-channel field effect transistor (PFET) region 20. The semiconductor substrate 16 may also include other elementary semiconductor materials such as germanium or SiGe alloy. Alternatively, the semiconductor substrate 16 may include a compound semiconductor such as, silicon carbide, gallium arsenide, indium arsenide, or indium phosphide. Further, the semiconductor substrate 16 may optionally include an epitaxial layer (epi layer), may be strained for performance enhancement, and/or may include a silicon-on-isolator (SOI) structure. As shown, an interlayer dielectric material 22 is formed on the semiconductor substrate 16 by chemical vapor deposition (CVD), high-density plasma CVD, spin-on, sputtering, or any other method known to those skilled in the art. The interlayer dielectric material 22 may include silicon oxide, silicon oxynitride, or a low dielectric constant material.

The interlayer dielectric material 22 defines a NFET trench 24 and a PFET trench 26 in the respective NFET and PFET regions 18 and 20. Typically, the NFET and PFET trenches 24 and 26 may be formed by depositing the interlayer dielectric material 22 around dummy gate patterns previously formed on the semiconductor substrate 16, and then removing the dummy gate patterns. As illustrated, a layer 28 of a high dielectric constant (high-k) insulator material is deposited overlying the NFET and PFET regions 18 and 20 including along the wall linings of the NFET and PFET trenches by ALD, CVD or the like. In an exemplary embodiment, the layer 28 has a thickness of from about 1 to about 20 Å and the high-k insulator material includes hafnium oxide, hafnium silicate, zirconium oxide, or hafnium aluminum oxide.

Figure 2:
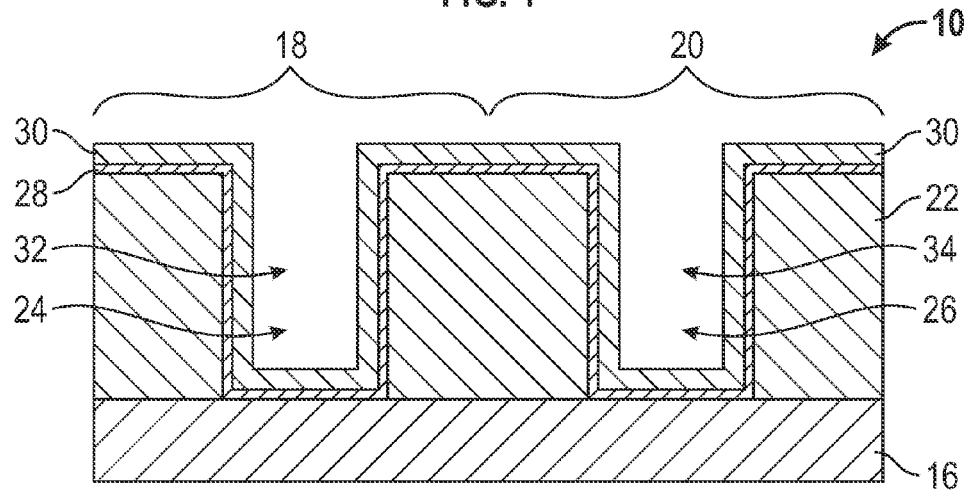
Figure 3:
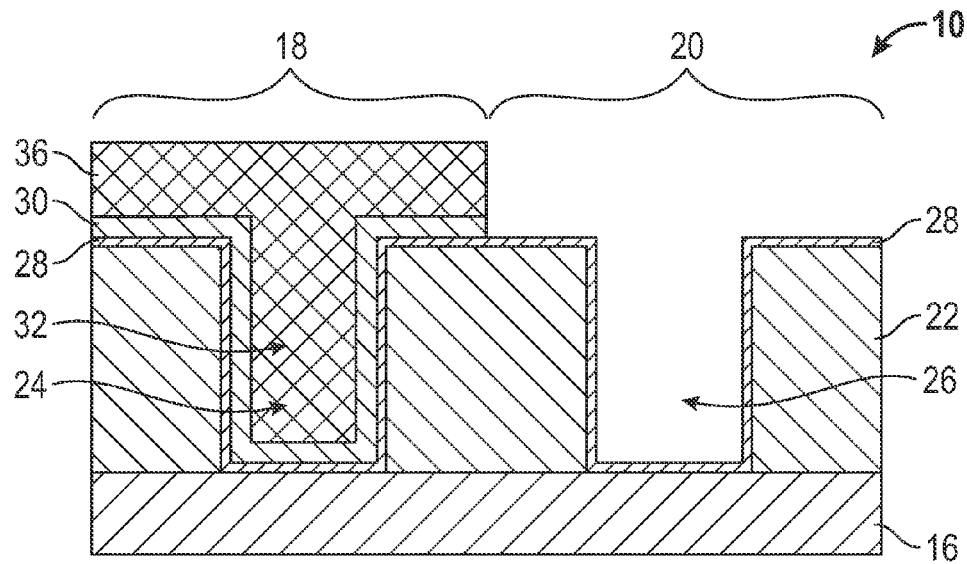

FIGS. 2-3 illustrate, in cross sectional views, the IC 10 at further advanced fabrication stages in accordance with an exemplary embodiment. The process continues by depositing a layer 30 of a N-type work function metal overlying the layer 28 of the high-k insulator material including in the NFET and PFET trenches 24 and 26. In an exemplary embodiment, the N-type work function metal is a conductive work function metal that is selected from the group of titanium, tantalum, hafnium, ytterbium silicide, erbium silicide, and titanium silicide. The layer 30 of the N-type work function metal may be deposited by CVD or by atomic layer deposition (ALD) to a thickness of from about 20 to about 60 Å. The deposition of the layer 30 is conformal and provides for control of the deposition thickness. The layer 30 partially fills the NFET and PFET trenches 24 and 26 and defines respective inner cavities 32 and 34 formed therein. As illustrated in FIG. 3, after forming the layer 30 of the N-type work function metal, the NFET region 18 is covered with an etch mask 36 and an exposed portion of the layer 30 of the N-type work function metal overlying the PFET region 20 is removed using an appropriate etch process.

Figure 4:
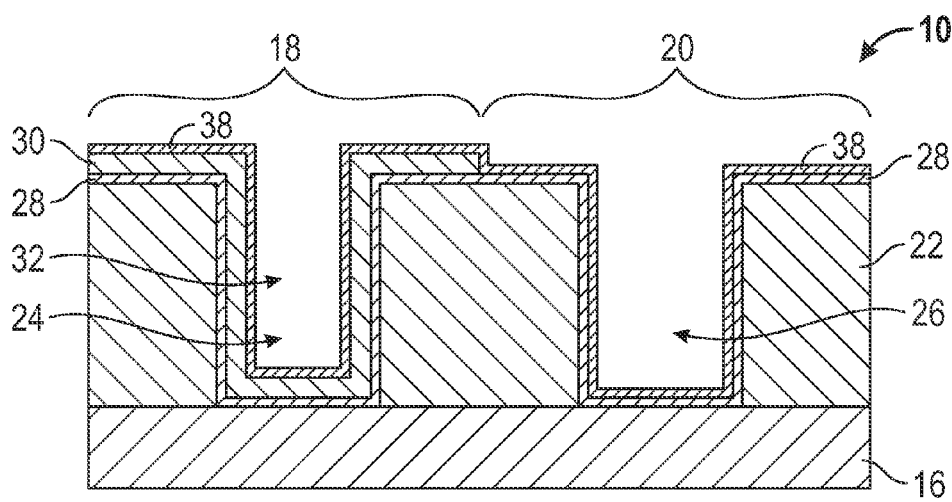
Figure 5:
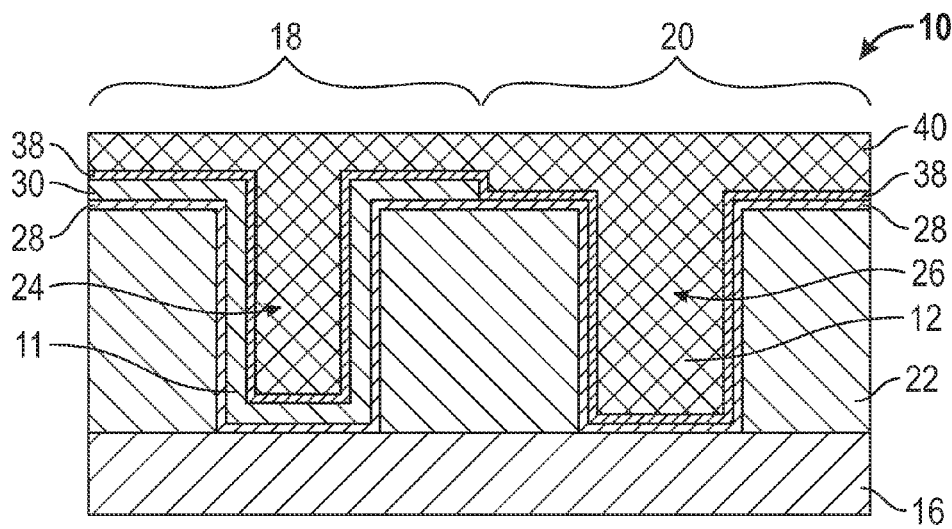

Referring to FIGS. 4-5, the IC 10 is illustrated at further advanced fabrication stages in accordance with an exemplary embodiment. The etch mask 36 illustrated in FIG. 3 is removed and a barrier layer 38 of barrier material is deposited via ALD, CVD or the like in the NFET and PFET regions 18 and 20. As illustrated, the barrier layer 38 overlies the layer 30 of the N-type work function metal in the NFET region 18 including in the NFET trench 24 and overlies the layer 28 of high-k insulator material in the PFET region 20 including in the PFET trench 26. In an exemplary embodiment, the barrier layer 38 has a thickness of from about 1 to about 20 Å and the barrier material includes hafnium carbide or titanium nitride that can be deposited by ALD, CVD, or the like.

As illustrated in FIG. 5, a metal fill 40 of a P-type work function metal is deposited overlying both the NFET and PFET regions 18 and 20 to form the metal gate structures 11 and 12 in the NFET and PFET trenches 24 and 26. In an exemplary embodiment, the P-type work function metal is a conductive work function metal that is selected from the group of cobalt, nickel, and tungsten silicide. The metal fill 40 fills the NFET and PFET trenches 24 and 26 including the inner cavity 32 (see FIG. 4) of the NFET trench 24. In an exemplary embodiment, the metal fill 40 is deposited by CVD to a thickness of from about 200 to about 3000 Å.

Figure 6:
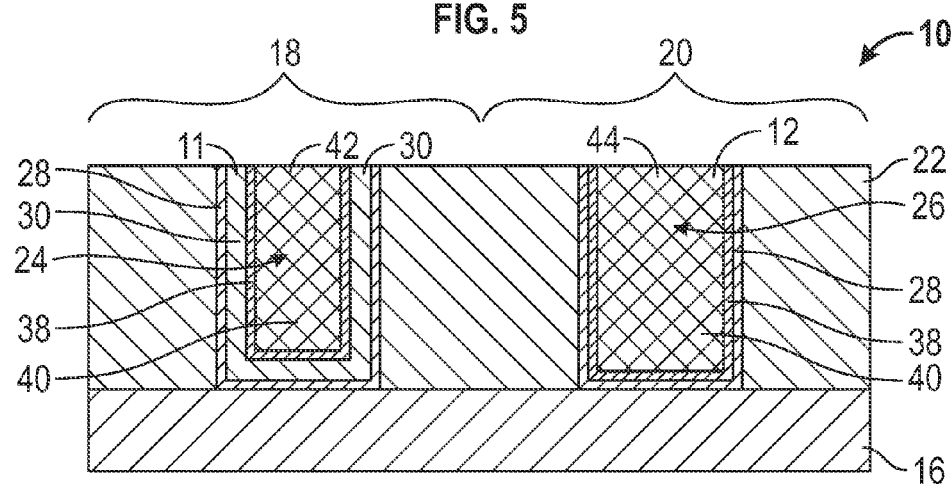
Figure 7:
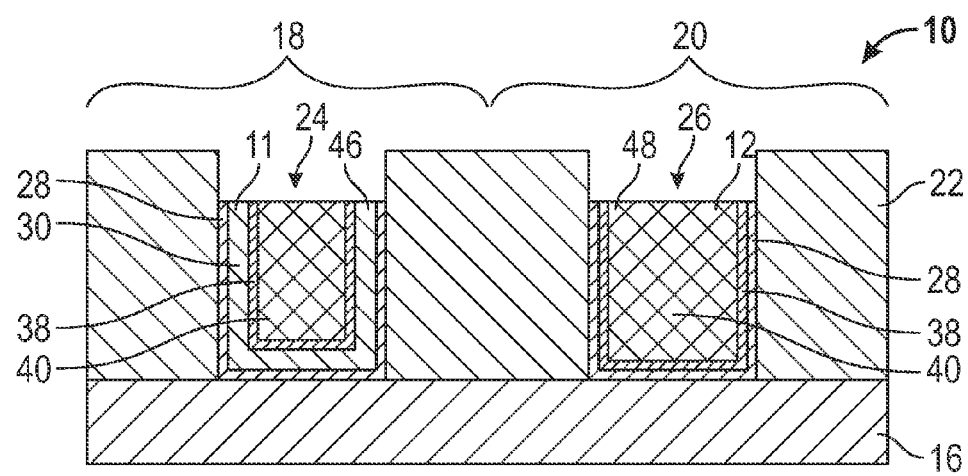
Figure 8:
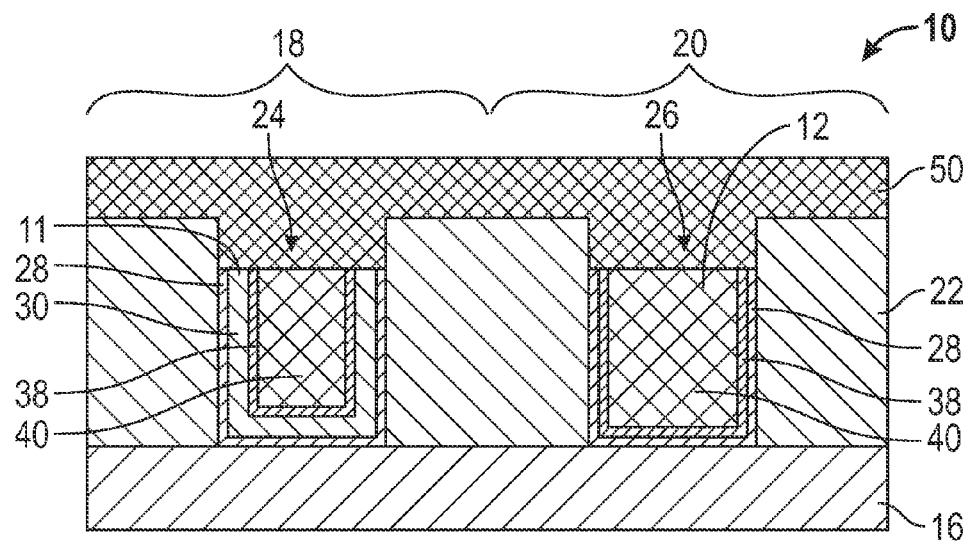

The process continues as illustrated in FIGS. 6-8 by planarizing the metal gate structures 12 and 14 to the interlayer dielectric material 22 using a chemical mechanical polishing (CMP) process. The planarization process removes the layer 28 of the high-k insulator material, the layer 30 of the N-type work function metal, the barrier layer 38, and the metal fill 40 of the P-type work function metal that are deposited outside of the NFET and PFET trenches 24 and 26. Then portions 42 and 44 of the metal gate structures 11 and 12 are recessed using an appropriate etching process to form recesses 46 and 48 in the NFET and PFET trenches 24 and 26, respectively, as shown in FIG. 7. Thereafter, an insulator 50, such as silicon nitride, is deposited overlying the NFET and PFET regions 18 and 20 in the recesses 46 and 48 to form a passivation layer over each of the metal gate structures 11 and 12 as illustrated in FIG. 8.

Figure 9:
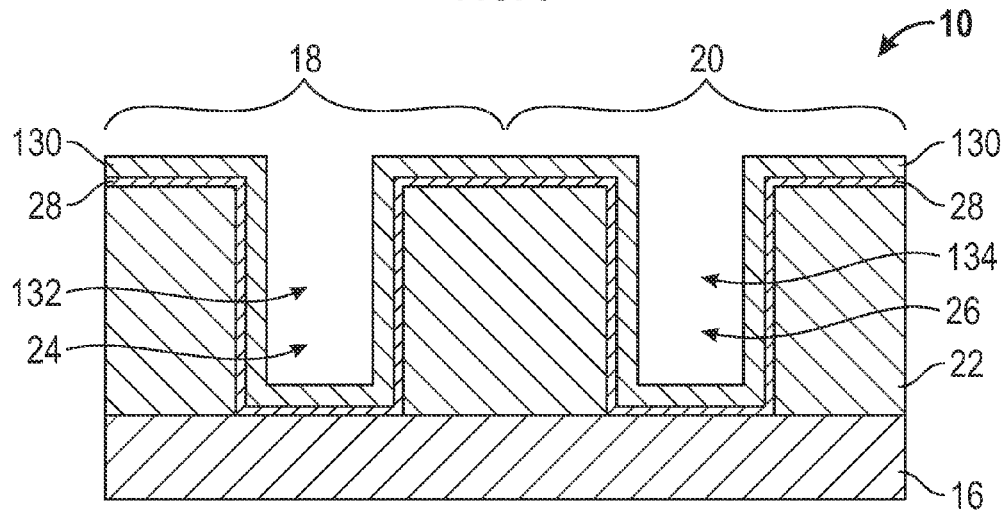
Figure 10:
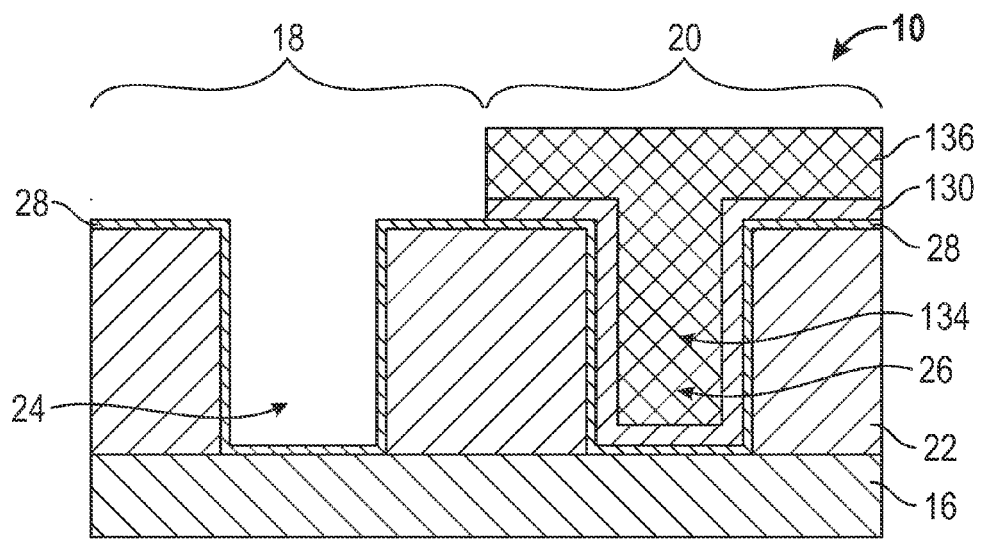

In another embodiment, after the formation of the NFET and PFET trenches 24 and 26 and the deposition of the layer 28 of the high-k insulator material as illustrated in FIG. 1, the process continues as illustrated in FIG. 9-10. In particular, a layer 130 of the P-type work function metal as discussed above is deposited overlying the layer 28 of the high-k insulator material and in the NFET and PFET trenches 24 and 26. The layer 130 of the P-type work function metal may be deposited by CVD or ALD to a thickness of from about 15 to about 90 Å. The deposition of the layer 130 is conformal and provides for control of the deposition thickness. The layer 130 partially fills the NFET and PFET trenches 24 and 26 and defines respective inner cavities 132 and 134 formed therein. As illustrated in FIG. 10, after forming the layer 130 of the P-type work function metal, the PFET region 20 is covered with an etch mask 136 and an exposed portion of the layer 130 of the P-type work function metal overlying the NFET region 18 is removed using an appropriate etch process.

Figure 11:
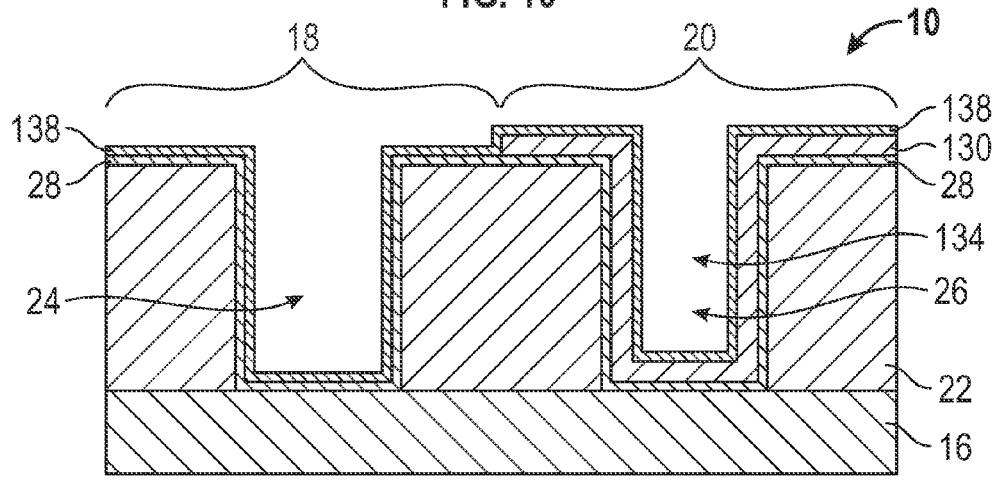
Figure 12:
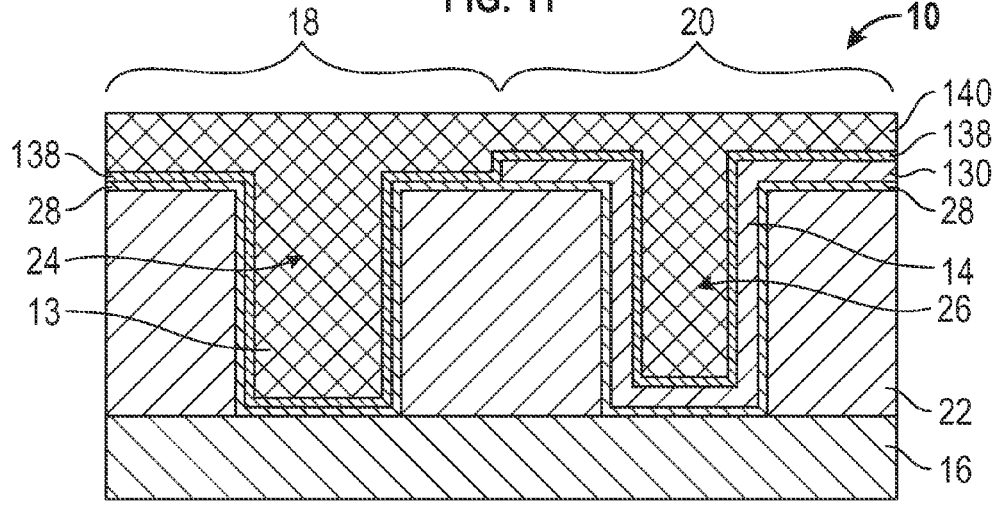

Referring to FIGS. 11-12, the IC 10 is illustrated at further advanced fabrication stages in accordance with an exemplary embodiment. The etch mask 136 illustrated in FIG. 10 is removed and a barrier layer 138 of barrier material is deposited via CVD or the like in the NFET and PFET regions 18 and 20. As illustrated, the barrier layer 138 overlies the layer 130 of the P-type work function metal in the PFET region 20 including in the PFET trench 26 and overlies the layer 28 of high-k insulator material in the NFET region 18 including in the NFET trench 24. In an exemplary embodiment, the barrier layer 138 has a thickness of from about 1 to about 10 Å and the barrier material includes hafnium carbide or titanium nitride.

As illustrated in FIG. 12, a metal fill 140 of the N-type work function metal as discussed above is deposited overlying both the NFET and PFET regions 18 and 20 to form the metal gate structures 13 and 14 in the NFET and PFET trenches 24 and 26. The metal fill 140 fills the NFET and PFET trenches 24 and 26 including the inner cavity 134 (see FIG. 11) of the PFET trench 26. In an exemplary embodiment, the metal fill 140 is deposited by CVD to a thickness of from about 200 to about 3000 Å.

Figure 13:
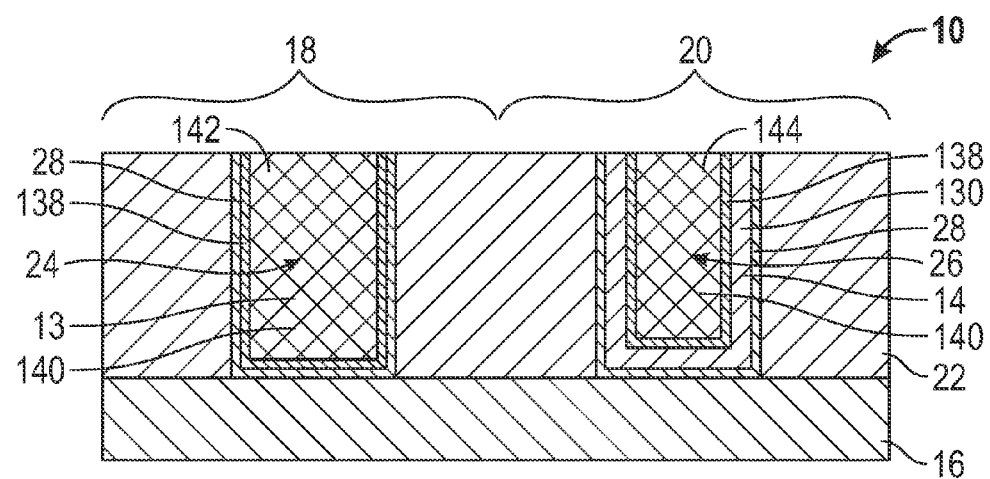
Figure 14:
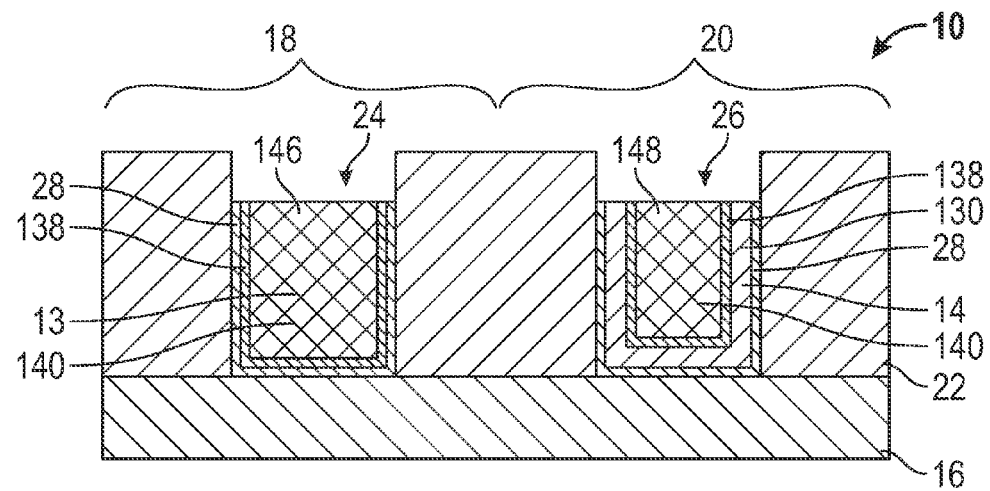
Figure 15:
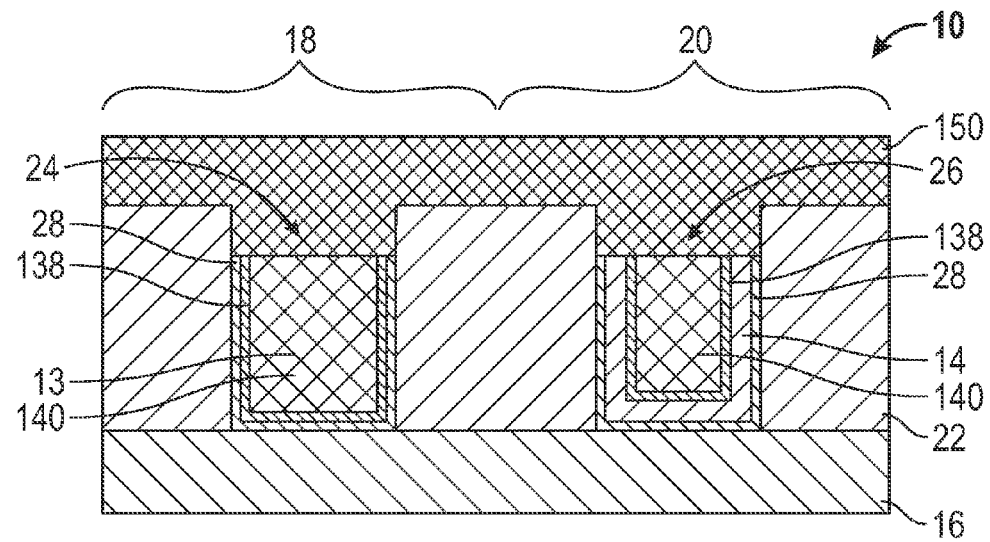

The process continues as illustrated in FIGS. 13-15 by planarizing the metal gate structures 13 and 14 to the interlayer dielectric material 22 using a CMP process. The planarization process removes the layer 28 of the high-k insulator material, the layer 130 of the P-type work function metal, the barrier layer 138, and the metal fill 140 of the N-type work function metal that are deposited outside of the NFET and PFET trenches 24 and 26. Then portions 142 and 144 of the metal gate structures 13 and 14 are recessed using an appropriate etching process to form recesses 146 and 148 in the NFET and PFET trenches 24 and 26, respectively, as shown in FIG. 14. Thereafter, an insulator 150, such as silicon nitride, is deposited overlying the NFET and PFET regions 18 and 20 in the recesses 146 and 148 to form a passivation layer over each of the metal gate structures 13 and 14 as illustrated in FIG. 15.

Accordingly, methods for fabricating integrated circuits to form improved metal gate structures have been described. Problems with conventional processes for forming metal gate structures can be reduced through the use of selected conductive N-type and P-type work function metals that reduce the number of steps and layers for forming the metal gate structures. As such, the gate forming process for the IC is simplified to improve process control and decrease variability, leakage, and Vt shift.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:

forming a first FET trench in a first FET region and a second FET trench in a second FET region of an interlayer dielectric material on a semiconductor substrate;

partially filling the first FET trench with a layer of a first work function metal to define an inner cavity in the first FET trench and partially filling the second FET trench with the first work function metal, wherein the first work function metal is one of a N-type work function metal and a P-type work function metal, and wherein the N-type work function metal is selected from the group consisting of titanium, tantalum, hafnium, ytterbium silicide, erbium silicide, and titanium silicide and the P-type work function metal is selected from the group consisting of cobalt, nickel, and tungsten silicide;

removing the first work function metal from the second FET trench;

depositing a second work function metal into the inner cavity and the second FET trench to fully fill the inner cavity and the second FET trench and form corresponding metal gate structures, wherein the second work function metal is the other one of the N-type work function metal and the P-type work function metal; and depositing a barrier layer of a barrier material in the first and second FET trenches prior to depositing the second work function metal to fully fill the inner cavity and the second FET trench but after removing the first work function metal from the second FET trench such that the barrier layer overlies the first work function metal in the first FET trench and not in the second FET trench.

2. The method of claim 1, wherein the first FET trench is a NFET trench and the second FET trench is a PFET trench, wherein partially filling comprises partially filling the NFET trench with the N-type work function metal, and wherein depositing comprises filling the PFET trench and the inner cavity of the NFET trench with the P-type work function metal.

3. The method of claim 1, wherein the first FET trench is a PFET trench and the second FET trench is a NFET trench, wherein partially filling comprises partially filling the PFET trench with the P-type work function metal, and wherein depositing comprises filling the NFET trench and the inner cavity of the PFET trench with the N-type work function metal.

4. The method of claim 1, wherein partially filling the first FET trench with the layer of the first work function metal comprises forming the layer having a thickness of from about 15 to about 90 Å.

5. The method of claim 1, wherein depositing comprises forming a second work function metal layer having a thickness of from about 200 to about 3000 Å.

6. The method of claim 1, further comprising:
forming a gate insulator layer of a high-k insulator material in each of the first and second FET trenches prior to partially filling the first FET trench.

7. The method of claim 6, wherein forming the gate insulator layer comprises forming the gate insulator layer of the high-k insulator material that comprises hafnium oxide, zirconium oxide, or hafnium aluminum oxide.

8. The method of claim 6, wherein forming the gate insulator layer comprises forming the gate insulator layer having a thickness of from about 1 to about 20 Å.

9. The method of claim 6, wherein after depositing the barrier layer, the barrier layer overlies and is in direct contact with the gate insulator layer in the second FET trench and overlies and is in direct contact with the first work function metal in the first FET trench.

10. The method of claim 9, wherein forming the barrier layer comprises forming the barrier layer of the barrier material that comprises hafnium carbide, or titanium nitride.

11. The method of claim 9, wherein forming the barrier layer comprises forming the barrier layer having a thickness of from about 1 to about 20 Å.

12. The method of claim 1, further comprising:
performing a single recessing process to recess portions of the corresponding metal gate structures to form recesses in the first and second trenches above the corresponding metal gate structures; and
depositing an insulator over each of the recesses to form a passivation layer over each of the corresponding metal gate structures.

13. A method for fabricating an integrated circuit, the method comprising:
forming a NFET trench in a NFET region and a PFET trench in a PFET region of an interlayer dielectric material on a semiconductor substrate;
depositing a layer of a N-type work function metal overlying the NFET and PFET regions to partially fill the NFET and PFET trenches and define an inner cavity in the NFET trench, wherein the N-type work function metal is selected from the group consisting of titanium, tantalum, hafnium, ytterbium silicide, erbium silicide, and titanium silicide;
removing the N-type work function metal overlying the PFET region including from the PFET trench;
depositing a P-type work function metal overlying the PFET and NFET regions to fully fill the PFET trench and the inner cavity of the NFET trench and form corresponding metal gate structures, wherein the P-type work function metal is selected from the group consisting of cobalt, nickel, and tungsten silicide; and
depositing a barrier layer of a barrier material in the PFET and NFET trenches prior to depositing the P-type work function metal to fully fill the PFET trench and the inner cavity of the NFET trench but after removing the N-type work function metal from the PFET trench such that the barrier layer overlies the N-type work function metal in the NFET trench and not in the PFET trench.

14. The method of claim 13, wherein removing the N-type work function metal comprises:
masking the NFET region; and
etching the PFET region to remove the N-type work function metal overlying the PFET region including from the PFET trench.

15. The method of claim 13, further comprising:
performing a single recessing process to recess portions of the corresponding metal gate structures to form recesses in the NFET and PFET trenches above the corresponding metal gate structures; and
depositing an insulator over each of the recesses to form a passivation layer over each of the corresponding metal gate structures.

16. The method of claim 15, further comprising:
planarizing the corresponding metal gate structures to the interlayer dielectric material prior to performing the single recessing process.

17. A method for fabricating an integrated circuit, the method comprising:
forming a NFET trench in a NFET region and a PFET trench in a PFET region of an interlayer dielectric material on a semiconductor substrate;
depositing a layer of a P-type work function metal overlying the NFET and PFET regions to partially fill the NFET and PFET trenches and define an inner cavity in the PFET trench, wherein the P-type work function metal is selected from the group consisting of cobalt, nickel, and tungsten silicide;
removing the P-type work function metal overlying the NFET region including from the NFET trench;

depositing a N-type work function metal overlying the NFET and PFET regions to fully fill the NFET trench and the inner cavity of the PFET trench and form corresponding metal gate structures, wherein the P-type work function metal is selected from the group consisting of titanium, tantalum, hafnium, ytterbium silicide, erbium silicide, and titanium silicide; and depositing a barrier layer of a barrier material in the PFET and NFET trenches prior to depositing the N-type work function metal to fully fill the NFET trench and the inner cavity of the PFET trench but after removing the P-type work function metal from the NFET trench such that the barrier layer overlies the P-type work function metal in the PFET trench and not in the NFET trench.

18. The method of claim 17, wherein removing the P-type work function metal comprises:

masking the PFET region; and etching the NFET region to remove the P-type work function metal overlying the NFET region including from the NFET trench.

19. The method of claim 17, further comprising:

performing a single recessing process to recess portions of the corresponding metal gate structures to form recesses in the NFET and PFET trenches above the corresponding metal gate structures; and depositing an insulator over each of the recesses to form a passivation layer over each of the corresponding metal gate structures.

20. The method of claim 19, further comprising:

planarizing the corresponding metal gate structures to the interlayer dielectric material prior to performing the single recessing process.

* * * * *